United States Patent
Lee et al.

(10) Patent No.: US 6,591,394 B2
(45) Date of Patent: Jul. 8, 2003

(54) THREE-DIMENSIONAL MEMORY ARRAY AND METHOD FOR STORING DATA BITS AND ECC BITS THEREIN

(75) Inventors: Thomas H. Lee, Cupertino, CA (US); James M. Cleeves, Redwood City, CA (US); Mark G. Johnson, Los Altos, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 80 days.

(21) Appl. No.: 09/747,574

(22) Filed: Dec. 22, 2000

(65) Prior Publication Data

US 2002/0083390 A1 Jun. 27, 2002

(51) Int. Cl.$^7$ .............................................. G11C 29/00
(52) U.S. Cl. ...................................................... 714/766
(58) Field of Search ........................ 430/22, 312, 313, 430/322; 714/763, 766; 257/777, 778, 686, 77, 278, 29.312, 27.026; 365/51, 63, 96, 225.7; 438/108, 107, 455, 505, 569, 796

(56) References Cited

U.S. PATENT DOCUMENTS

| | | |
|---|---|---|
| 4,646,266 A | 2/1987 | Ovshinsky et al. |
| 5,065,389 A | 11/1991 | Roth |
| 5,119,291 A | 6/1992 | Flannagan et al. |
| 5,313,425 A | 5/1994 | Lee et al. |
| 5,321,824 A | 6/1994 | Burke et al. |
| 5,432,729 A | 7/1995 | Carson et al. |
| 5,448,728 A | 9/1995 | Takano et al. |
| 5,469,450 A | 11/1995 | Cho et al. |
| 5,469,451 A | 11/1995 | Henmi |
| 5,559,732 A * | 9/1996 | Birge .................... 365/112 |
| 5,559,778 A | 9/1996 | Inokuchi et al. |
| 5,708,667 A | 1/1998 | Hayashi |
| 5,761,741 A | 6/1998 | Robbins et al. |
| 5,784,391 A | 7/1998 | Konigsburg |
| 5,796,694 A | 8/1998 | Shirane |
| 5,835,396 A | 11/1998 | Zhang |
| 5,835,509 A | 11/1998 | Sako et al. |
| 5,915,167 A * | 6/1999 | Leedy ...................... 438/107 |
| 5,943,254 A | 8/1999 | Bakeman, Jr. et al. |
| 6,016,269 A | 1/2000 | Peterson et al. |
| 6,034,882 A | 3/2000 | Johnson et al. |
| 6,052,816 A | 4/2000 | Yoshinogawa |

(List continued on next page.)

FOREIGN PATENT DOCUMENTS

| | | |
|---|---|---|
| EP | 0 073 486 A2 | 3/1983 |
| EP | 1 017 100 A1 | 7/2000 |
| WO | WO 99/14763 | 3/1999 |

OTHER PUBLICATIONS

Construction techniques for systematic SEC–DED codes with single byte error detection and partial correction capability for computer memory systems; Penzo, L. Sciuto, D. Silvano, C. ;IEEE ; On pp. 584–591; Mar. 1995.*

(List continued on next page.)

*Primary Examiner*—Albert Decady
*Assistant Examiner*—Guy Lamarre
(74) *Attorney, Agent, or Firm*—Brinks Hofer Gilson & Lione

(57) ABSTRACT

A three-dimensional memory array and method for storing data bits and ECC bits therein is provided. A three-dimensional memory array of the type that includes multiple vertically-stacked layers of memory cells is described. The three-dimensional memory array comprises a plurality of memory cells arranged in a plurality of physically-independent sub-arrays, and data bits and error checking and correcting (ECC) bits of a word are stored in respective ones of the physically-independent sub-arrays. By spatially diffusing data bits and ECC bits from a word, the likelihood of multiple-bit errors within the word is reduced. This is advantageous since most ECC circuitry is capable of correcting only single-bit errors within a given word.

30 Claims, 3 Drawing Sheets

U.S. PATENT DOCUMENTS

| | | | |
|---|---|---|---|
| 6,108,236 | A | 8/2000 | Barnett |
| 6,185,122 | B1 | 2/2001 | Johnson et al. |
| 6,208,545 | B1 | 3/2001 | Leedy |
| 6,216,247 | B1 | 4/2001 | Creta et al. |
| 6,236,587 | B1 | 5/2001 | Gudesen et al. |
| 6,321,358 | B1 | 11/2001 | Anderson |
| 6,321,360 | B1 | 11/2001 | Takeuchi et al. |
| 6,336,175 | B1 | 1/2002 | Shaath et al. |
| 6,377,526 | B1 | 4/2002 | Vining et al. |
| 6,446,177 | B1 | 9/2002 | Tanaka et al. |
| 6,480,463 | B2 | 11/2002 | Hunter et al. |
| 2002/0034105 | A1 | 3/2002 | Kulkarni et al. |

OTHER PUBLICATIONS

NN8803151, IBM Technical Disclosure Bulletin, "Incremental Directory Indexes for Write–Once Media", Mar., 1988, vol. 30, Issue 10, pp. 151–155.

"Jack St. Clair Kilby," Jones Telecommunications & Multimedia Encyclopedia, http://www.digitalcentury.com/encyclo/update/kilby.html, 4 pages (1999).

"The 'Chip' Inventors (part 1)," Dan Murray, http://www.livingstonmontana.com/access/dan/150thechipinventors–1.html, 3 pages (1999).

T. R. Reid, "The Chip: How Two Americans Invented the Microchip and Launched a Revolution," pp. 22–23 (1984).

"About Jack" http://www.ti.com/corp/docs/kilbyctr/jackbuilt.shtml, 6 pages (2002).

"Definition: integrated circuit," http://www.its.bldrdoc.gov/fs–1037/dir–019/_2755.htm, 1 page (1996).

Meindl, "Definitions of Terms for Integrated Electronics,"IEEE Journal of Solid–State Circuits, p. 2 (Mar. 1967).

Muller et al., "Device Electronics for Integrated Circuits," second edition, pp. 65 and 106 (1986).

"3D–ROM—A First Practical Step Towards 3D–IC," Zhang, 7 pages, Jul. 2000.

"Reed–Solomon Codes," http://www.4i2i.com/reed_solomon_codes.htm, 8 pages (1998).

"Three–Dimensional Memory Array and Method of Fabrication," U.S. patent application Ser. No. 09/560,626, filed Apr. 28, 2000; inventor: Johan Knall.

"Write–Once Memory Array Controller, System, and Method," U.S. patent application Ser. No. 09/638,427, filed Aug. 14, 2000; inventors: Derek J. Bosch, Christopher S. Moore, Daniel C. Steere, and J. James Tringali.

"Low–Cost Three–Dimensional Memory Array," U.S. patent application Ser. No. 09/638,428, filed Aug. 14, 2000; inventors: Mark G. Johnson, Thomas H. Lee, Vivek Subramanian, and P. Michael Farmwald.

"Modular Memory Device," U.S. patent application Ser. No. 09/638,334, filed Aug. 14, 2000; inventors: J. James Tringali, P. Michael Farmwald, Thomas H. Lee, Mark G. Johnson, and Derek J. Bosch.

"Memory Devices and Methods for Use Therewith," U.S. patent application Ser. No. 09/748,589, filed Dec. 22, 2000; inventors: Roger W. March, Christopher S. Moore, Daniel Brown, Thomas H. Lee, and Mark G. Johnson.

"Computer Engineering: Hardware Design," M. Morris Mano, Chapter 6–4 Error Detection and Correction, pp. 199–202 (1988).

Jul. 18, 2001 Information Disclosure Statement (2 pages).

* cited by examiner

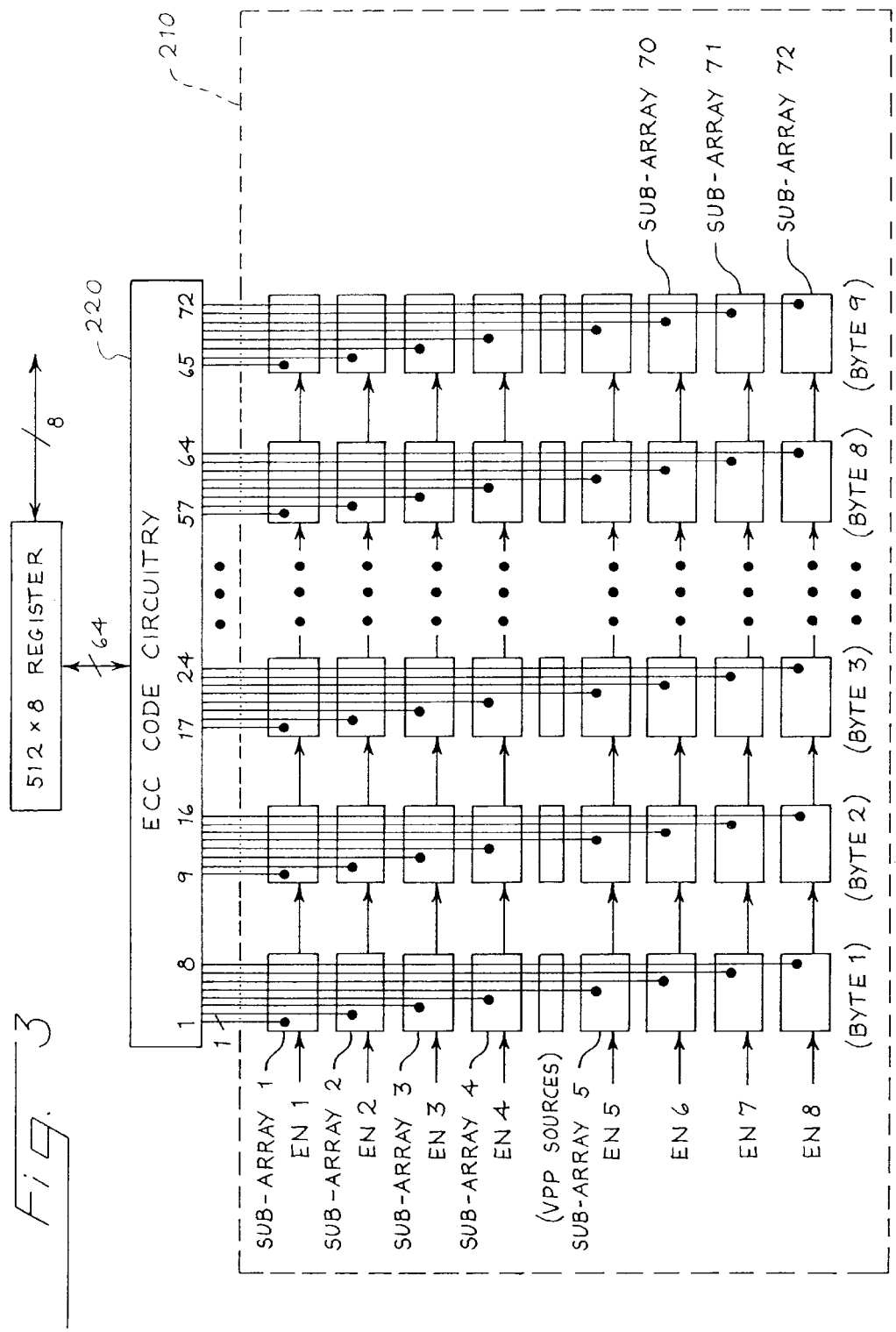

US 6,591,394 B2

THREE-DIMENSIONAL MEMORY ARRAY AND METHOD FOR STORING DATA BITS AND ECC BITS THEREIN

BACKGROUND

Conventional memory design assumes that high-speed read access is an important goal. Accordingly, conventional two-dimensional semiconductor memories, such as DRAMs, SRAMs, ROMs, EEPROMs, and Flash memories, are designed to maximize speed. These memories achieve fast access time at the expense of large chip area and high chip cost. To increase circuit performance, some conventional memory devices store data bits and error checking and correcting (ECC) bits near each other to reduce the portions of the memory device that are activated. By localizing the data bits and ECC bits within a region of the memory device, more than one bit is retrieved from a single activated row line, thereby reducing the power consumed by a memory cycle. While localizing data bits and ECC bits within a region of the memory device can increase circuit performance, such a data distribution scheme can result in non-correctable memory errors. Most ECC circuitry is capable of correcting only single-bit errors within a given word. For example, with a Hamming (72, 64) code scheme, only a single-bit error in 72 bits of stored data can be corrected. Storing data bits and ECC code bits in physically-contiguous regions of the memory array increases the probability that a media defect will affect more than a single bit in any data word, thereby increasing the probability of a non-correctable error.

In contrast to conventional memory arrays, three-dimensional memory arrays, such as those described in U.S. Pat. No. 6,034,882 to Johnson, provide important economies in terms of reduced size and associated reductions in manufacturing cost. Manufacturing defects or age-related fatigue of such high bit-density memory devices can raise the probability of bit errors. Accordingly, the disadvantages associated with storing data bits and ECC code bits in physically-contiguous regions of the memory array can be more exaggerated in three-dimensional memory arrays as compared to conventional memory arrays.

SUMMARY

The present invention is defined by the following claims, and nothing in this section should be taken as a limitation on those claims.

By way of introduction, the preferred embodiments described below provide a three-dimensional memory array and method for storing data bits and ECC bits therein. In one preferred embodiment, a three-dimensional memory array of the type that includes multiple vertically-stacked layers of memory cells is provided. The three-dimensional memory array comprises a plurality of memory cells arranged in a plurality of physically-independent sub-arrays, and data bits and error checking and correcting (ECC) bits of a word are stored in respective ones of the physically-independent sub-arrays. By spatially diffusing data bits and ECC bits from a word, the likelihood of multiple-bit errors within the word is reduced. This is advantageous since most ECC circuitry is capable of correcting only single-bit errors within a given word. Other preferred embodiments are disclosed.

The preferred embodiments will now be described with reference to the attached drawings.

BRIEF DESCRIPTION OF THE DRAWINGS

FIG. 3 is a block diagram of a three-dimensional memory array of a preferred embodiment.

DETAILED DESCRIPTION OF THE PRESENTLY PREFERRED EMBODIMENTS

General Overview of Three-Dimensional Memory Arrays

The following section provides a general overview of three-dimensional memory arrays. U.S. Pat. No. 5,835,396 to Zhang, U.S. Pat. No. 6,034,882 to Johnson, U.S. patent application Ser. No. 09/560,626 to Knall, and U.S. patent application Ser. No. 09/638,428 to Johnson may be taken as examples of three-dimensional memory arrays. Each of these patent documents is hereby incorporated by reference. Further details regarding alternative structures are presented in U.S. patent applications Ser. Nos. 09/638,427 and 09/638,334, both of which are assigned to the assignee of the present application and are hereby incorporated by reference.

In a three-dimensional memory array, memory cells are organized and built in three dimensions rather than two. There are several layers of memory cells, and the layers are vertically stacked above one another. The three dimensions are called "rows," "columns," and "layers." Typically, the rows and columns are generally parallel to the upper surface of an underlying substrate, and the layers are separated from one another along a direction perpendicular to the upper surface of the underlying substrate. It should be noted that some memory cells contain an element which protrudes either upwardly or downwardly and have, in the past, been referred to as a "three-dimensional memory cell." However these memory cells are arrayed in a conventional two-dimensional array. This is quite different from the three-dimensional memory devices described herein, which includes a three-dimensional array of memory cells, with several layers of memory cells stacked vertically above one another. A significant feature of these memory devices is that memory operating speed is decreased in exchange for low-cost, three-dimensional organization. These memory devices use very small switching devices, giving a small memory cell and a small total chip area. The small switching devices also give a small read current, which makes the read access time relatively slow. However, there are several important memory applications that can easily tolerate a slow access time and derive tremendous benefit from dramatically lower memory cost. Some of these applications are discussed in more detail below in the "Applications" section.

Figure 1:
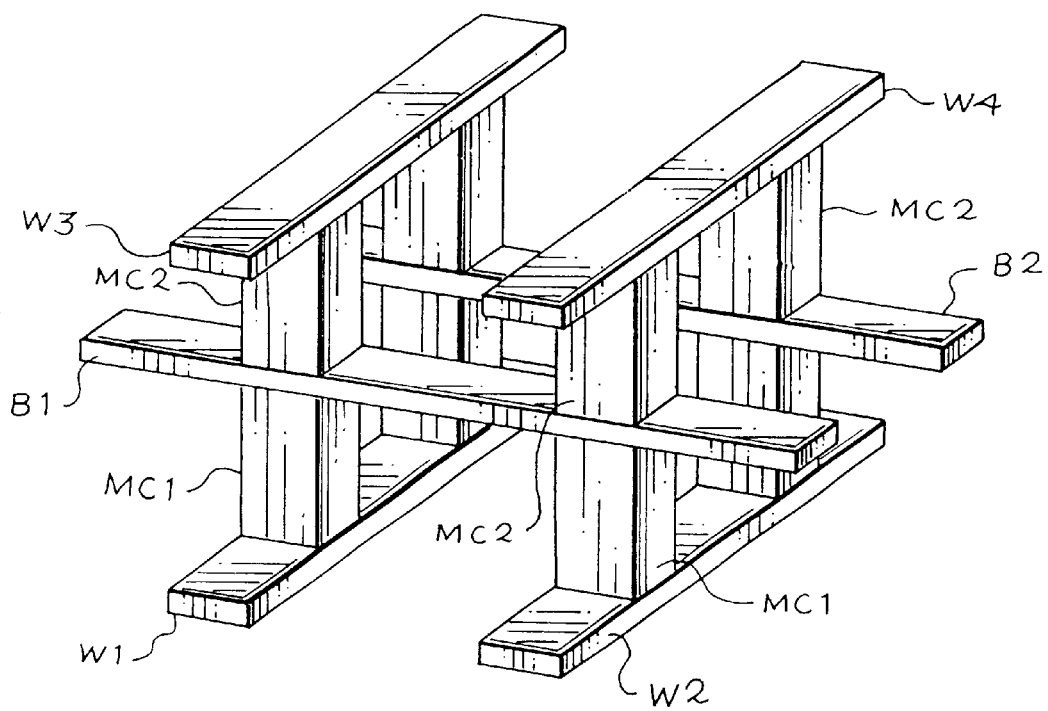
FIG. 1 is a schematic diagram of a three-dimensional memory array of a preferred embodiment.

Turning now to the drawings, FIG. 1 shows a schematic representation of one embodiment of a three-dimensional memory array. Each of the memory cells MC1, MC2 is a two-terminal cell that includes a state storage element. In this embodiment, the memory cells MC1 are arranged at a first level, and the memory cells MC2 are arranged at a second level that is vertically stacked with respect to the first level. The terminals of the memory cells MC1, MC2 are disposed at the respective ends of the cell. In this connection, the term "terminal" is intended broadly, and a terminal may be embodied simply as a terminal portion of the cell or as a separate layer of the cell. Each of the terminals of each of the memory cells MC1, MC2 is in electrical contact with a respective conductor or wire. The conductors W1, W2 at the bottom of the memory cells MC1 in the view of FIG. 1 are configured as wordlines, and the conductors B1, B2 connected to the upper terminals of the memory cells MC1 are configured as bitlines, which in this embodiment run substantially perpendicularly to the wordlines W1, W2. Thus, each of the memory cells MC1 bridges a selected one of the wordlines W1, W2 and a selected one of the bitlines B1, B2. Similarly, the memory cells MC2 of the second layer are connected between selected ones of the bitlines B1, B2 and selected wordlines W3, W4. The wordlines W3, W4 in this embodiment are disposed on another level, vertically stacked above the level of the bitlines B1, B2.

The memory cell array of FIG. 1 can be similar in basic geometry and materials to that described in FIGS. 6a through 6g of the above-identified U.S. Pat. No. 6,034,882 to Johnson. For embodiments in which the basic cell size in plan view is 2F by 2F (such as taught by the above-identified Johnson or Knall patent documents), the pitch of the memory cell (the total width of 100 adjacent cells, divided by 100) is preferably no larger than about 0.50 microns (and generally no larger than 2 microns) in either the wordline or bitline direction, and the total area consumed by a memory cell is preferably no larger than approximately 0.25 square microns. The chip area consumed is then approximately $\leq 0.25$ square millimeters per million bits on each layer of the vertical stack. Stating the same result another way, the packing density is $\geq 4$ million bits per square millimeter on each layer of the vertical stack. Vertical stacking increases density and decreases chip area for a given size of a memory array; in a preferred embodiment having eight layers of memory cells vertically stacked above one another, the density is $\geq 32$ million bits per square millimeter of chip area.

Memory cells comprised of semiconductor materials are preferred, such as those described in the above-identified Johnson, Knall, and Zhang patent documents. These memory cells are more easily manufactured in state-of-the-art factories having fine-pitch photolithography. However, memory cells that comprise other materials such as the phase-change materials described in U.S. Pat. No. 4,646,266 to Ovshinsky, and organic-electronics-based materials such as those described in PCT WO 99/14763 to Gudesen are also suitable. The Ovshinsky and Gudesen patent documents are hereby incorporated by reference in their entirety. Memory cells comprising materials such as amorphous solids (see the Ovshinsky patent) are also suitable. Magnetic-based memory devices (e.g., magnetic tunnel junction (MTJ) memories) can also be used. Three-dimensional memory arrays which are fabricated in layers, vertically stacked above a semiconductor substrate, and in particular a monocrystalline semiconductor substrate, are preferred. This makes it more straightforward to implement the input and output functions of the memory array, by using conventional semiconductor circuitry such as CMOS built in the substrate. Other substrates, including insulating substrates for example, are also suitable.

While the foregoing description provided numerous specific details such as specific materials and dimensions, it is apparent to one skilled in the art that the present invention may be practiced without these details. Further, well-known circuits and fabrication techniques have not been set forth in detail in order not to unnecessarily obscure the present invention.

Error Checking and Correcting (ECC) Code Embodiments

Figure 2:
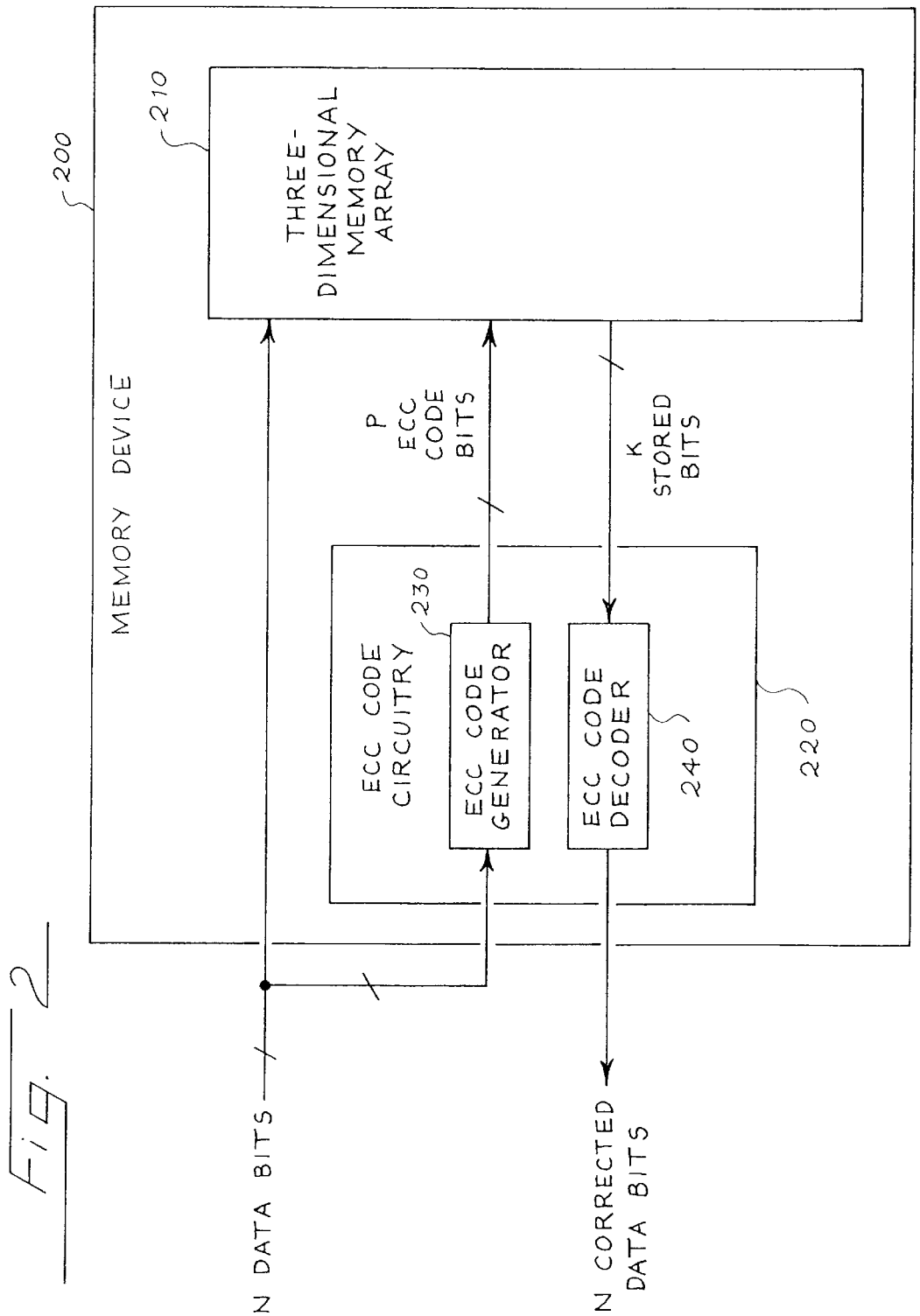
FIG. 2 is an illustration of a memory device of a preferred embodiment having embedded ECC code circuitry.

Turning again to the drawings, FIG. 2 is an illustration of a memory device 200 of a preferred embodiment. This memory device 200 comprises a three-dimensional memory array 210 and embedded error checking and correcting (ECC) code circuitry 220. Memory devices with embedded ECC code circuitry are described in U.S. patent application Ser. No. 09/748,589, filed on the same date as the present application. That application, which is assigned to the assignee of the present invention, is hereby incorporated by reference.

While the following preferred embodiment will be described in terms of embedded ECC code circuitry, it should be noted that ECC code circuitry can be implemented external to the memory device. Such an implementation avoids the access speed penalty imposed by the ECC code circuitry, which can be approximately equivalent to 50–75 gate delays and may degrade the performance of a memory device to an unacceptable level. Three-dimensional memory arrays, however, are optimized for high density and low cost and are not necessarily optimized for access speed. With these memory devices, the delays associated with integrated ECC code circuitry are relatively unimportant, and the use of integrated ECC code circuitry may be preferred since manufacturing defects and/or age-related fatigue can raise the probability of bit errors.

The ECC code circuitry 220 comprises an ECC code generator 230 and an ECC code decoder 240. The ECC code generator 230 accepts n data bits to be stored in the memory cells of the three-dimensional memory array 210 as input and produces p ECC code bits as output. The n data bits are stored with the p ECC code bits as a k-bit word in the three-dimensional memory array 210. Preferably the ECC code circuitry 220 implements a Hamming (k, n) code scheme (e.g., a Hamming (72, 64) code scheme). When the k stored bits are retrieved from the three-dimensional memory array 210, they are fed through the ECC code decoder 240. The ECC code circuitry 220 compares the parity bits computed from k (out of n) retrieved bits and compares those parity bits with the ones stored. If there is a mismatch, the ECC code circuitry 220 corrects the error (if one bit). The n corrected data bits are then outputted by the ECC code decoder 240. With a Hamming (72, 64) code scheme, the 8 ECC code bits are used to identify and correct any single-bit error in the 72-bits of stored data. (The presence of two errors in the 64-bit word can be determined but not corrected.) U.S. patent application Ser. No. 09/748, 649, which is assigned to the assignee of the present invention and is incorporated by reference herein, provides additional information about reading and writing from the memory array.

In the preferred embodiment shown in FIG. 3, the memory cells of the three-dimensional memory array 210 are arranged in a plurality of sub-arrays. Specifically, the memory cells are divided into 72 physically-independent or distinct sub-arrays. To decrease the likelihood of multiple-bit errors within a single word, it is preferred that the data bits and the ECC code bits be spatially diffused in the three-dimensional memory array 210. Each bit of a given 72-bit word (i.e., 64 data bits plus 8 ECC code bits) is stored in one of the 72 sub-arrays. Since each bit is stored in its own sub-array, a manufacturing defect located in a portion of sub-array #5, for example, would only cause an error in the 5th bit of any given word. Since single-bit errors are correctable using ECC, this data distribution technique allows the memory device to function perfectly if all of sub-array #5 were completely non-functional but the other sub-arrays were functional. In other words, in contrast to a localized data strategy, an entire sub-array can fail without affecting the ability of the ECC coding to correct the resulting single-bit failure. Accordingly, the Hamming (72, 64) code scheme permits the memory device 200 to tolerate one defective bit out of every 72 bits. This defect rate (about 1.4%) exceeds the defect percentages encountered in typical integrated circuit manufacturing.

As shown by the foregoing example, storing logically contiguous data in a physically non-contiguous manner reduces the probability that a media defect will affect more than a single bit in any data word. This is advantageous since most ECC circuitry is capable of correcting only single-bit errors within a given data word (e.g., of 64 bit length). Storing data and ECC bits in respective individual, physically-separate sub-arrays, therefore, provides extra robustness in the presence of manufacturing defects or other errors in a region of a memory device. Bit errors are, thus, hidden from the end user, and this data distribution strategy results in error-free data even when there are defects in the memory array proper. It should be understood, however, that depending on the statistics of defect distributions, other data distribution schemes may be appropriate.

For example, the two-dimensional interleaved Reed-Solomon technique may be preferred if defects are found to cluster geographically.

Applications

Although three-dimensional memory arrays can be slower than conventional memory arrays, there are several important memory applications that can easily tolerate a slow access time and derive tremendous benefit from dramatically lower memory cost. Many of these low-speed applications may be collected together under the name "digital media storage" and include digital storage of still pictures (e.g., photographs), video (e.g., sequences of images), audio (e.g., music), books, maps, and numerous other examples that will be readily apparent to those skilled in the art. Further, three-dimensional memory arrays provide important economies in terms of reduced size of the memory array and associated reductions in manufacturing cost, which are important in consumer products such as digital cameras, digital audio players, and electronic books.

Figure 4:
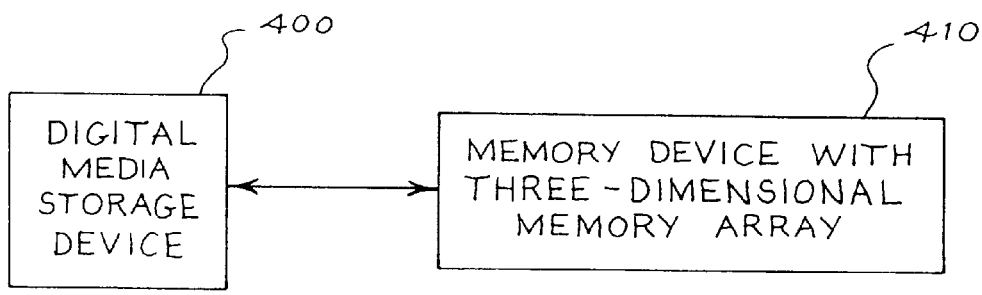
FIG. 4 is a block diagram of a digital media storage device and a memory device of a preferred embodiment.

Turning again to the drawings, FIG. 4 shows a digital media storage device 400 coupled with a memory device with a three-dimensional memory array 410. As used herein, the term "coupled with" is intended broadly to cover elements that are coupled directly as well as elements that are coupled indirectly through one or more intervening components. The memory device 410 is preferably coupled to the digital media storage device 400 by an electrical connector, such that the memory device 410 can readily be removed from the digital media storage device 400 and replaced with another memory device. For example, the digital media storage device 400 can be a digital audio player, a digital camera, a digital book, a personal digital assistant, a game player, a cellular telephone, or a general-purpose programmable computer, and the memory device 410 can take the form of a card, stick, or other modular unit that is readily inserted into and removed from a corresponding port in the digital media storage device 400.

The memory cells of the memory device 410 preferably are field-programmable. As used herein the term "field-programmable" refers to memory devices that can be written into at the command of a consumer as for example when it is desired to load a new digital media file into the memory device. For example, the digital media storage device 400 may receive digital media files from a source such as a network (e.g., the Internet) or another computer such as a collection of digital media files at a retail outlet. The digital media storage device 400 receives downloaded digital media files from the source and writes the downloaded digital media files into the field-programmable memory cells of the memory device 410. In some cases, the memory device may be field programmed directly by the source of digital media files, rather than by the digital media storage device 400.

It should be noted that these preferred embodiments can be implemented as write-once or write-many and that the following claims shall not be read as requiring a write-once memory device unless specifically recited. Also, it should be noted that any or all of the embodiments described herein can be used alone or in combination.

The forgoing detailed description has described only a few of the many possible implementations of the present invention. For this reason, this detailed description is intended by way of illustration, and not by way of limitation. It is only the following claims, including all equivalents, that are intended to define the scope of this invention.

What is claimed is:

1. A three-dimensional memory array comprising a plurality of memory cells arranged in a plurality of physically-independent sub-arrays and storing a word of n data bits and p ECC bits, wherein each of the n data bits and p ECC bits is stored in respective ones of the physically-independent sub-arrays.

2. The three-dimensional memory array of claim 1, wherein the three-dimensional memory array comprises a plurality of write-once memory cells.

3. The three-dimensional memory array of claim 1, wherein the three-dimensional memory array is selected from the group consisting of a semiconductor-transistor-technology-based memory array, a magnetic-based memory array, and an organic-electronic-based memory array.

4. The three-dimensional memory array of claim 1, wherein the three-dimensional memory array is part of a memory device comprising ECC code circuitry operative to generate the p ECC bits based on the n data bits.

5. The three-dimensional memory array of claim 1, wherein the memory cells are arranged in a plurality of layers of memory cells stacked vertically above one another in a single integrated circuit.

6. The three-dimensional memory array of claim 1, wherein each memory cell comprises exactly two terminals.

7. The three-dimensional memory array of claim 1, wherein the three-dimensional memory array comprises a plurality of wires comprising wordlines and bitlines, and wherein each memory cell is connected to exactly two wires: the respective wordline and the respective bitline.

8. The three-dimensional memory array of claim 1, wherein the memory cells comprise a semiconductor material.

9. The three-dimensional memory array of claim 1, wherein the memory cells comprise a material selected from the group consisting of an organic polymer, a phase change material, and an amorphous solid.

10. The three-dimensional memory array of claim 1, wherein the memory cells store digital media information selected from the group consisting of: digital text, digital books, digital music, digital audio, at least one digital still image, a sequence of digital images, digital video, at least one digital map, and combinations thereof.

11. The three-dimensional memory array of claim 1 in combination with a digital media storage device coupled with the three-dimensional memory array, the storage device operative to generate the p ECC bits from the n data bits.

12. The three-dimensional memory array of claim 11, wherein the storage device is selected from the group consisting of a digital camera, a digital audio playback device, and digital audio book.

13. A method for storing data bits and error checking and correcting (ECC) code bits in a three-dimensional memory array, the method comprising:

providing a three-dimensional memory array comprising a plurality of memory cells arranged in a plurality of physically-independent sub-arrays; and storing a word of n data bits and p ECC bits in the three-dimensional memory array by storing each of the n data bits and p ECC bits in respective ones of the plurality of physically-independent sub-arrays.

14. The method of claim 13, wherein the three-dimensional memory array comprises a plurality of write-once memory cells.

15. The method of claim 13, wherein the three-dimensional memory array is selected from the group consisting of a semiconductor-transistor-technology-based memory array, a magnetic-based memory array, and an organic-electronic-based memory array.

16. The method of claim 13, wherein the three-dimensional memory array is part of a memory device comprising ECC code circuitry, and wherein the method further comprises generating the p ECC bits based on the n data bits with the ECC code circuitry.

17. The method of claim 13, wherein the memory cells are arranged in a plurality of layers of memory cells stacked vertically above one another in a single integrated circuit.

18. The method of claim 13, wherein each memory cell comprises exactly two terminals.

19. The method of claim 13, wherein the three-dimensional memory array comprises a plurality of wires comprising wordlines and bitlines, and wherein each memory cell is connected to exactly two wires: the respective wordline and the respective bitline.

20. The method of claim 13, wherein the memory cells comprise a semiconductor material.

21. The method of claim 13, wherein the memory cells comprise a material selected from the group consisting of an organic polymer, a phase change material, and an amorphous solid.

22. The method of claim 13, wherein the memory cells store digital media information selected from the group consisting of: digital text, digital books, digital music, digital audio, at least one digital still image, a sequence of digital images, digital video, at least one digital map, and combinations thereof.

23. The method of claim 13 further comprising generating the p ECC bits from the n data bits with a digital media storage device coupled with the three-dimensional memory array.

24. The method of claim 23, wherein the storage device is selected from the group consisting of a digital camera, a digital audio playback device, and digital audio book.

25. A memory device comprising:
   a three-dimensional memory array comprising a plurality of memory cells arranged in a plurality of physically-independent sub-arrays; and
   error checking and correcting (ECC) code circuitry in communication with the three-dimensional memory array;
   wherein the memory device stores each bit of a word of n data bits and p ECC bits in respective ones of the physically-independent sub-arrays.

26. The memory device of claim 25, wherein the three-dimensional memory array comprises a plurality of write-once memory cells.

27. The memory device of claim 25, wherein the three-dimensional memory array is selected from the group consisting of a semiconductor-transistor-technology based memory array, a magnetic-based memory array, and an organic-electronic-based memory array.

28. The memory device of claim 25, wherein the memory cells are arranged in a plurality of layers of memory cells stacked vertically above one another in a single integrated circuit.

29. The memory device of claim 25, wherein the memory cells comprise a semiconductor material.

30. The memory device of claim 25, wherein the memory cells comprise a material selected from the group consisting of an organic polymer, a phase change material, and an amorphous solid.

* * * * *

UNITED STATES PATENT AND TRADEMARK OFFICE
CERTIFICATE OF CORRECTION

PATENT NO. : 6,591,394 B2
DATED : July 8, 2003
INVENTOR(S) : Thomas H. Lee et al.

It is certified that error appears in the above-identified patent and that said Letters Patent is hereby corrected as shown below:

Title page,
Item [56], References Cited, FOREIGN PATENT DOCUMENTS, insert
-- EP   1 168 150 A1   02/2002 --.

Column 8,
Line 25, delete "technology based" and substitute -- technology-based -- in its place.

Signed and Sealed this

Twentieth Day of July, 2004

JON W. DUDAS
*Acting Director of the United States Patent and Trademark Office*